(12) United States Patent
Lu et al.

(10) Patent No.: US 6,818,535 B2
(45) Date of Patent: Nov. 16, 2004

(54) THIN PHOSPHORUS NITRIDE FILM AS AN N-TYPE DOPING SOURCE USED IN A LASER DOPING TECHNOLOGY

(75) Inventors: Jeng Ping Lu, Mountain View, CA (US); Ping Mei, Palo Alto, CA (US); James B. Boyce, Los Altos, CA (US)

(73) Assignee: Xerox Corporation, Stamford, CT (US)

( * ) Notice: Subject to any disclaimer, the term of this patent is extended or adjusted under 35 U.S.C. 154(b) by 69 days.

(21) Appl. No.: 10/282,265

(22) Filed: Oct. 28, 2002

(65) Prior Publication Data

US 2003/0067037 A1 Apr. 10, 2003

Related U.S. Application Data

(62) Division of application No. 09/473,576, filed on Dec. 28, 1999, now Pat. No. 6,586,318.

(51) Int. Cl.⁷ .............................................. H01L 21/00
(52) U.S. Cl. ........................ 438/585; 438/482; 438/486
(58) Field of Search .............................. 438/535, 482, 438/486, 795, 771, 787, 520, 522, 952, 481, 517, 557, 131, 158, 199, 770, 981, 780, 487, 519, 758, 162, 163, 166, 940, 257–267

(56) References Cited

U.S. PATENT DOCUMENTS

| | | | | | |
|---|---|---|---|---|---|
| 4,276,557 | A | * | 6/1981 | Levinstein et al. | 257/755 |
| 5,871,826 | A | * | 2/1999 | Mei et al. | 427/596 |
| 5,885,904 | A | * | 3/1999 | Mehta et al. | 438/758 |
| 5,904,575 | A | * | 5/1999 | Ishida et al. | 438/770 |
| 5,908,307 | A | * | 6/1999 | Talwar et al. | 438/199 |
| 5,918,140 | A | * | 6/1999 | Wickboldt et al. | 438/535 |
| 5,965,603 | A | * | 10/1999 | Johnson et al. | 514/450 |
| 6,019,796 | A | * | 2/2000 | Mei et al. | 438/151 |
| 6,020,223 | A | * | 2/2000 | Mei et al. | 438/158 |
| 6,107,641 | A | * | 8/2000 | Mei et al. | 257/66 |
| 6,586,318 | B1 | * | 7/2003 | Lu et al. | 438/535 |

FOREIGN PATENT DOCUMENTS

JP   2001223174 A  *  8/2001  ......... H01L/21/225

OTHER PUBLICATIONS

Nangia et al, "N–type (phosphorus) Doping of Silicon by Zone Melting Using a Solid Dopant Source", Indian Journal of Pure and Applied Physics, vol. 16, No. 1 p. 14–16, Jan. 1978 (abstract only).*

Mei, P. et al, "Pulsed Laser Crystallization and Doping for Thin Film Transistors," Journal of Non–Crystalline Solids, North–Holland Publishing Company, Amsterdam, NL., vol. 266–269, May 2000, pp. 1252–1259.

Raicis, M. et al, "Solid Planar Diffusion Sources Based on Phosphorus Nitride Prepared by a One–Stage Process in a Pulse Discharge," Surface and Coatings Technology, Elsevier, Amsterdam, NL, vol. 78, No. 1–03, Jan. 1996, pp. 238–242.

* cited by examiner

Primary Examiner—Carl Whitehead, Jr.
Assistant Examiner—Laura M Schillinger
(74) Attorney, Agent, or Firm—Kent Chen

(57) ABSTRACT

An improved method and system for laser doping a semiconductor material is described. In the invention, phosphorous nitride is used as a dopant source. The phosphorous nitride is brought into close proximity with a region of the semiconductor to be doped. A pulse of laser light decomposes the phosphorous nitride and briefly melts the region of semiconductor to be doped to allow incorporation of dopant atoms from the phosphorous nitride into the semiconductor.

8 Claims, 4 Drawing Sheets ered in the previously referenced patent
THIN PHOSPHORUS NITRIDE FILM AS AN N-TYPE DOPING SOURCE USED IN A LASER DOPING TECHNOLOGY

CROSS-REFERENCE TO RELATED APPLICATIONS

This is a divisional of application Ser. No. 09/473,576, filed Dec. 28, 1999, now U.S. Pat. No. 6,586,318.

FIELD OF THE INVENTION

The invention relates to an improved method of laser doping a semiconductor material. In particular, the invention describes an improved doping source for use in laser doping.

BACKGROUND

In recent years, laser doping has become a popular method for fabricating large area electronics. The low processing temperatures used in a laser doping process makes the process suitable for doping semiconductor layers on substrates that have low temperature tolerances. Examples of substrates with low temperature tolerances include plastic and glass.

A second reason for the popularity of laser doping is the availability of techniques to make self-aligned amorphous silicon Thin Film Transistors (TFT). Self aligned techniques for forming TFTs utilize the gate electrode as a mask, thereby minimizing alignment problems when forming a passivation island over the gate electrode. Detailed methods for forming such self aligned structure are described in an article by P. Mei, G. B. Anderson, J. B. Boyce, D. K. Fork, and R. Lujan entitled Thin Film Transistor Technologies III published in the Electrochemical Soc. Proc. PV 96-23., p. 51 (1997). U.S. patent application Ser. No. D/97343 entitled "Method of manufacturing a Thin Film Transistor with reduced parasitic capacitance and reduced feed-through voltage" by P. Mei, R. Lujan, J. B. Boyce, C. Chua and M. Hack, also describes fabricating a TFT structure using a self alignment process and is hereby incorporated by reference.

During laser doping, a laser pulse briefly melts a surface layer in a doping region of a semiconductor. While the doping region is in a molten state, a dopant source is introduced near a surface of the doping region. The dopant source provides dopant atoms that are distributed through the surface layer. After the doping region solidifies, the dopants are available for electrical activation.

Typical dopant sources used to provide dopant atoms include: (1) gas dopant sources such as phosphorus fluoride ($PF_5$) and boron fluoride ($BF_3$), (2) spin-on dopants such as phosphorous doped silica solution, and (3) phosphor-silicon alloys which may be ablated from another substrate or deposited directly on the doping region.

Each of the above described dopant sources has a corresponding disadvantage. For example, gas dopant sources are difficult to control and require the use of specialized equipment to prevent uneven distribution of dopants. Furthermore, both gas and spin-on deposition techniques have low doping efficiencies. A low doping efficiency makes it difficult to fabricate a heavily doped material. Phosphor-silicon alloy materials are difficult to deposit and unstable when exposed to moisture in air. In particular, moisture in the air decomposes the phosphor-silicon alloy. After decomposition, the moisture may redistribute the dopant atoms. Dopant atom redistribution produces high defect rates in devices formed from the doped semiconductor.

Ion implantation provides an alternate method of distributing dopant atoms in a semiconductor. However, when used in large area processes, ion implantation requires expensive specialized equipment.

Thus an improved method of laser doping is needed.

SUMMARY OF THE INVENTION

Although laser doping has become a popular method of fabricating large area electronic devices, current laser dopant sources are difficult to control, require expensive equipment, or are unstable when exposed to moisture in the air. In order to avoid these problems, the invention describes a technique for using a thin film of dopant containing compound (DCC) as a laser doping source. The dopant containing compound (DCC) can be deposited by standard equipment and is stable in air. An example of a dopant containing compound is phosphorous nitride.

In one embodiment of the invention, standard plasma enhanced chemical vapor deposition (PECVD) equipment is used to deposit a thin phosphorous nitride film over the dopant region. Alternatively, a transparent dopant plate may be used to position the phosphorous nitride near the dopant region in a laser ablation process. In laser ablation, a laser decomposes the phosphorous nitride. The laser also briefly melts the semiconductor in the dopant region to allow incorporation of dopant atoms into the doping region. After the doping process, remaining phosphor nitride may be removed using a plasma containing small amounts of CF4 diluted in oxygen.

DETAILED DESCRIPTION

Figure 1A:
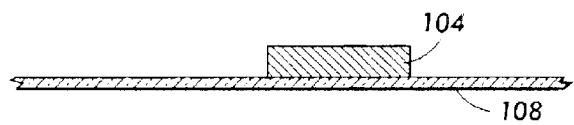
FIG. 1 illustrates a sequence of operations used to fabricate a Thin Film Transistor (TFT) structure using one embodiment of the invention.
Figure 1B:
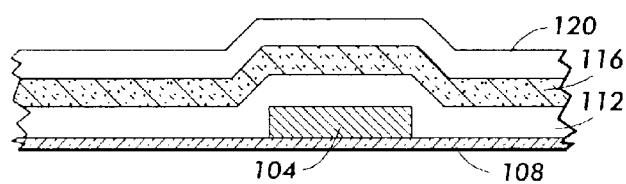
Figure 1C:
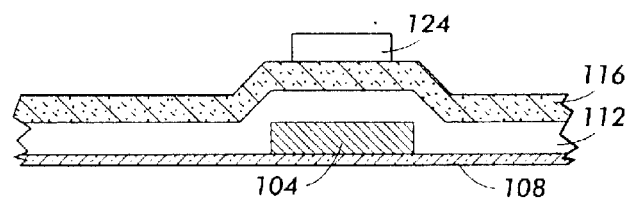
Figure 1D:
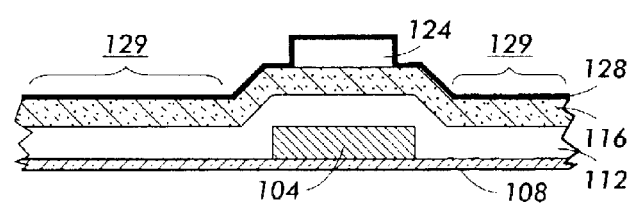
Figure 1E:
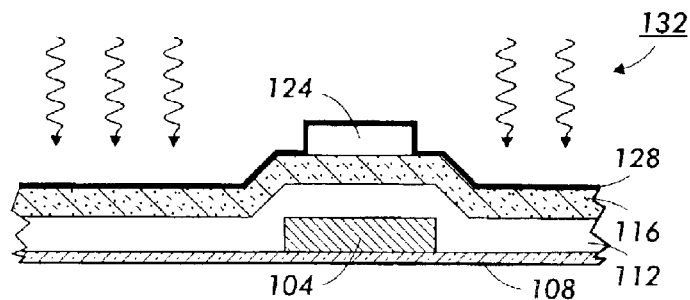
Figure 1F:
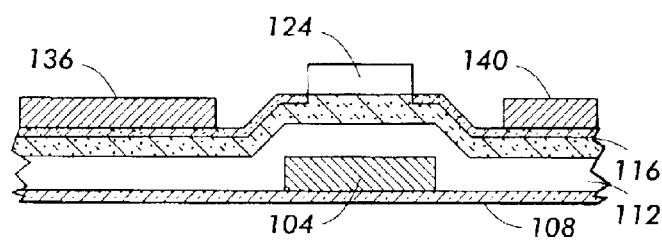
Figure 1G:
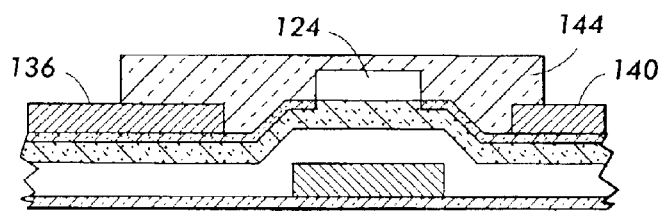

FIG. 1 illustrates the fabrication of a thin film transistor (TFT) by laser doping portions of the TFT with a phosphorous nitride thin film. Although the structure described is a TFT structure, it is understood that the described doping techniques are applicable to a large range of devices including other semiconductor active and passive devices such as resistors and transistors used in integrated circuits.

In FIG. 1, a metal gate 104 is deposited and patterned over a glass substrate 108. A deposition techniques, such as plasma enhanced chemical vapor deposition (PECVD) is used to deposit a plurality of layers over the gate 104 and substrate 108. In the embodiment illustrated, the layers include a nitride layer 112, an amorphous silicon layer 116 and a top passivation layer 120. In one embodiment of the invention, top passivation layer 120 is a multilayer structure formed from alternating nitride and oxide multilayers. A backside exposure that uses metal gate 104 as a mask may be used to form an island 124 from the top passivation layer 120. Using a backside exposure simplifies the alignment of island 124 with gate 104. The procedures used to form and pattern the gate metal, to deposit the nitride, amorphous silicon and passivation layers and to pattern the passivation layer are described in the previously referenced patent application entitled "Method of Manufacturing a Thin Film Transistor with Reduced Parasitic Capacitance and Reduced Feed-Through Voltage".

After formation of island 124, a doping region of amorphous silicon is doped. In the illustrated embodiment, doping regions 129 are positioned on both sides of island 124. To dope the amorphous silicon, a DCC compound that includes at least one element from either from column III or column V of the periodic table is brought in close proximity to the amorphous silicon. Typical compounds may include the column III or column V element chemically bonded to form a nitride or oxide. As used herein, a "compound" is defined as a combination of two or more elements that form a chemical bond. Thus a "compound" does not include mixtures or alloys in which the elements are not chemically bonded together. For example, water is defined as a compound whereas a mixture of hydrogen and oxygen is for purposes of this patent not considered a compound.

One example of a compound that has been found to be suitable as a doping source is phosphorous nitride. The chemical bond between phosphor and nitride in the phosphor nitride compound makes the compound stable in air; phosphor itself is unstable in air.

A first method of forming phosphorous nitride is to evaporate phosphor in a $N_2$ plasma. The evaporated phosphor deposits over the substrate as a phosphorous nitride film. Alternatively, a pulse discharge of a phosphorus powder covered electrode in a $N_2$ ambient gas may also be used to form a phosphorous nitride compound. Both techniques of generating a phosphorous nitride film are described in an article entitled "Solid Planar Diffusion Sources Based on Phosphorus Nitride Prepared by a One-stage Process in a Pulse Discharge" by M. Raicis and L. Raicis in Surface and Coatings Technology, Vol. 78, p. 238 (1996).

An alternate method of bringing a DCC, including an element from column 3 or column 5 of the periodic table, into close proximity to amorphous silicon uses commercially available PECVD equipment. In the following description, example parameters used to achieve PECVD deposition of a phosphorous nitride film 130 will be provided. In the example, a processing gas of one sccm (Standard cubic centimeter per minute) $PH_5$ and 100 sccm $NH_3$ is formed. Ten watts of 13.5 MHz radio frequency power in a 400 mTorr ambient pressure converts the processing gas into a plasma. Exposing a substrate, such as glass substrate 108 at 250 degrees Centigrade, to the plasma results in a phosphorous nitride thin film with a reflection index of approximately 1.85. Using the provided example parameters results in a deposition rate of approximately 50 Angstroms per minute.

After deposition, a laser beam 132 irradiates the phosphorous nitride thin film to laser dope select regions of amorphous silicon 116. In one embodiment, laser beam 132 originates from an excimer laser with a high fluence laser beam having a wavelength of 308 nm. The laser beam briefly melts the amorphous silicon and decomposes the phosphorous thin film 128. The decomposing phosphorous thin film introduces phosphor atoms into the molten layer of amorphous silicon.

Figure 2:
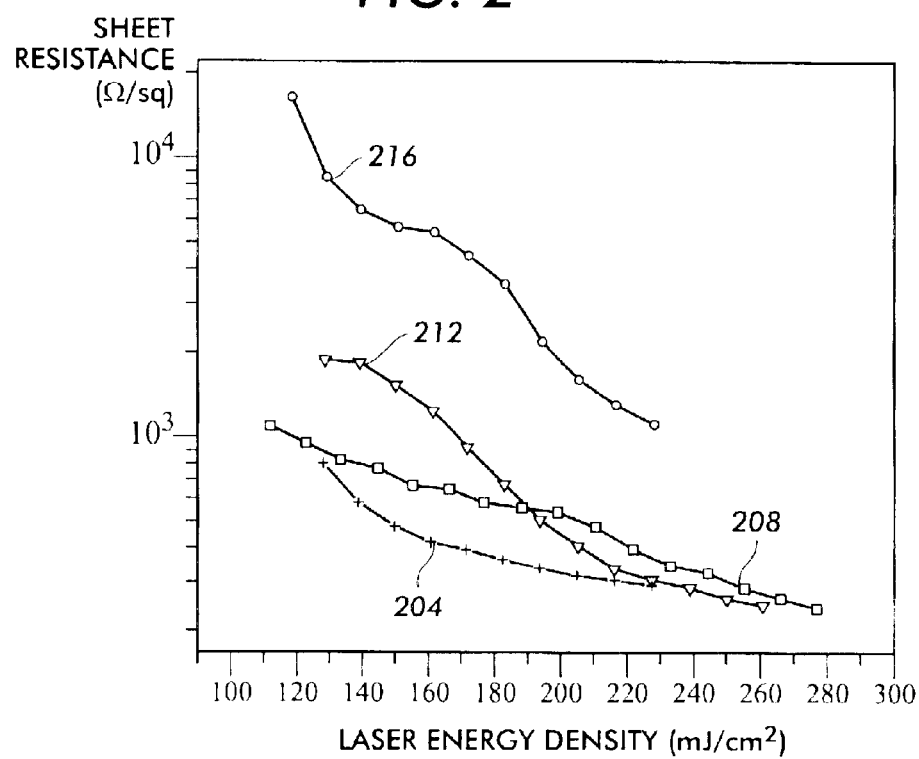
FIG. 2. is a graph illustrating the resistivity of laser doped amorphous silicon as a function of changing laser energies and dopant sources.

FIG. 2 is a graph that illustrates the sheet resistance of a doped amorphous silicon layer as a function of laser energy density used in laser doping. Each curve of the graph corresponds to a different dopant source. Curve 204 corresponds to a phosphorous nitride dopant source, curve 208 corresponds to a Psi alloy as a dopant source, curve 212 corresponds to a P+ implantation at a dosage of $3\times10^{15}$ cm$^{-2}$ and curve 216 corresponds to a P+ implantation at a dosage of $1\times10^{15}$ cm$^{-2}$. The measurements were taken on a structure including a nitride and a 500 angstrom thick amorphous silicon layer deposited on a glass substrate.

To form the structure from which measurements were taken, 100 Angstroms of phosphorous nitride film was deposited over the amorphous silicon using the previously described example PECVD process. Pulses of laser light from a XeCl excimer laser decomposes the phosphorous nitride.

After exposure to the excimer laser, a four point probe was used to measure the resistivity of the resulting doped amorphous silicon structure. At each laser energy density value plotted along a horizontal axis of FIG. 2, the phosphorous nitride dopant source plotted as curve 204, produced the lowest resistance doped amorphous silicon. A low resistance demonstrates the high doping efficiency of the phosphorous nitride by indicating that almost all of the phosphorous nitride film decomposes under the laser exposure.

Returning to FIG. 1, after exposure of portions of the phosphorous nitride thin film to laser radiation, areas unexposed to laser radiation may remain covered by the phosphorous nitride film. In particular, during fabrication of laser-doped, self-aligned TFT structures, portions of phosphorous nitride films 128 deposited over passivation island 124 may not absorb or receive sufficient exposure to laser energy and thus may not be fully decomposed. Unexposed phosphorous nitride film has a very high resistivity. Therefore, in some TFT embodiments, the unexposed phosphorous nitride remains in the device without disturbing the self-aligned TFT operation. The high resistivity of phosphorus nitride allows its use as a gate dielectric material for InP MISFETS as described in an article entitled "Enhancement mode InP MISFET's with sulfide passivation and photo-CVD grown P3N5 gate insulators" by Y. Jeong, S. Jo, B. Lee and T. Sugano in the IEEE Electron Device Letters, Vol 16, Page 109 (1995).

When complete removal of phosphorous nitride is desired, a plasma cleaning process may be implemented. In one implementation of such a plasma cleaning process, a small amount of CF4, typically 1 to 2 percent in $O_2$, is used to remove the undesirable phosphorous nitride.

After removal of undesired portions of phosphorous nitride thin film 128, metal source contact 136 and metal drain contact 140 are formed over the doped areas of amorphous silicon layer 116. To complete the TFT structure, a second passivation island 144 of $SiO_2$ may be formed between metal source contact 136 and metal drain contact 140.

Figure 4:
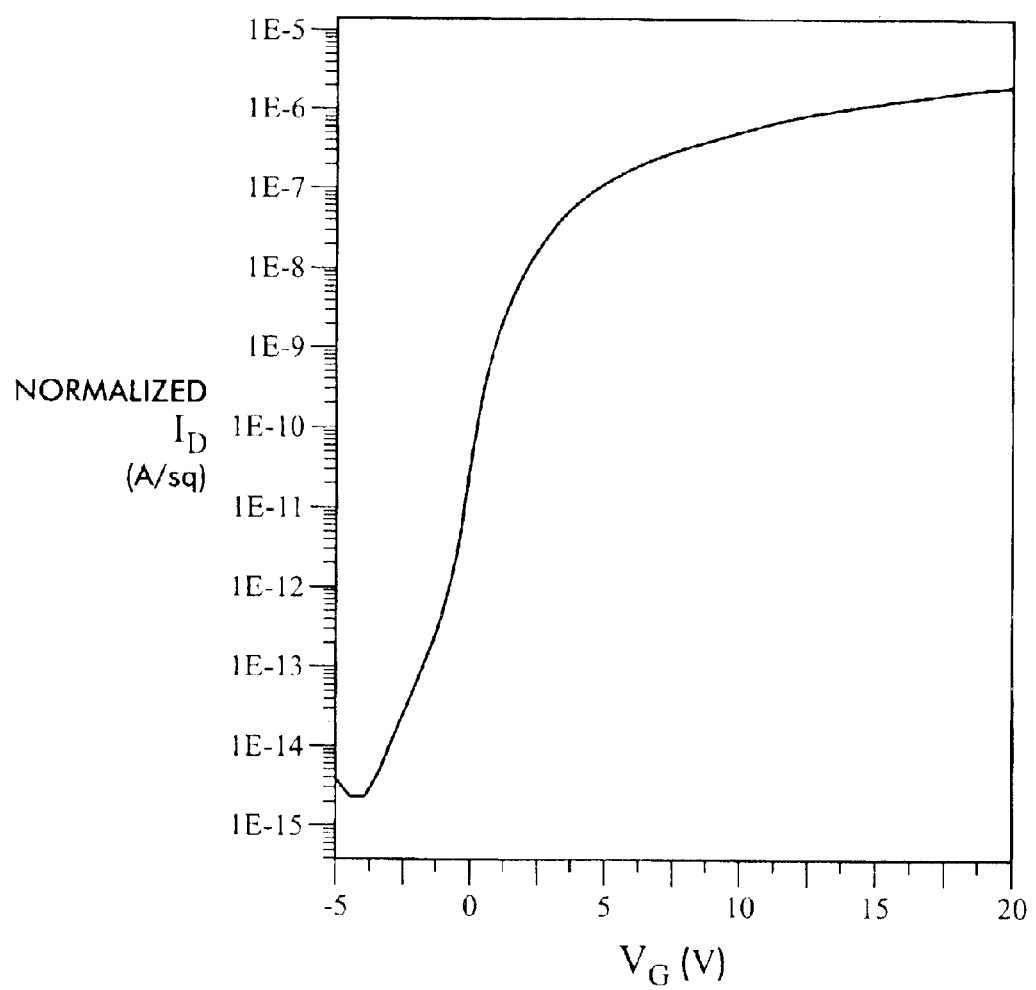
FIG. 4 is a plot illustrating the TFT transfer characteristic of a device fabricated using a phosphorous nitride dopant.

A typical transfer characteristic curve of a TFT fabricated by the process described above is shown in FIG. 4. FIG. 4 plots a normalized drain current as a function of an applied gate voltage. The performance is comparable to devices formed using dopant sources that are unstable in air such as structures described in the previously referenced patent by Mei et. al.

Figure 3:
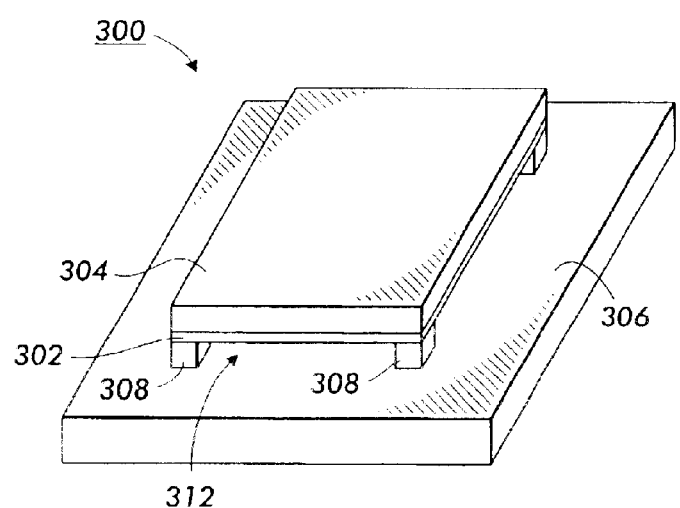
FIG. 3 illustrates a system that uses laser ablation to provide dopant atoms from a film of phosphorous nitride to dope a semiconductor sample.

Although the prior description has described using a PECVD technique to deposit the phosphorous nitride directly on a device for laser doping, it should be recognized that other techniques may be used to bring phosphorous nitride in close proximity to the device to be doped. For example, FIG. 3 shows a system 300 for depositing phosphorous nitride using laser ablation. In FIG. 3, phosphorous nitride film 302 is deposited over a surface of a transparent source plate 304. The transparent source plate is positioned in close proximity to the semiconductor sample 306 with the phosphorous nitride film coated surface facing semiconductor sample 306. Gap 312 that separates the phosphorous nitride film 302 and semiconductor sample 306 is typically several microns, although the gap may range from zero to several millimeters. The height of spacers 308 determines the size of the gap. The smaller the gap between phosphorous nitride film 302 and semiconductor sample 306, the higher the dopant efficiency.

After phosphorous nitride film 302 is properly positioned over the semiconductor to be doped, a laser such as an excimer laser, outputs a laser beam that propagates through source plate 304 and irradiates a select area of phosphorous nitride film 302. The phosphorous nitride film absorbs a portion of the laser energy. When the phosphorous nitride film absorption rate is too low, a thin layer of opaque material, such as a-Si, may be inserted between plate 304 and phosphorous nitride film 302 to enhance the efficiency of laser energy absorption. Absorbed energy from the laser pulse ablates phosphorous nitride film 302 causing phosphorous nitride film 302 to release energetic dopants into the gap between film 302 and semiconductor sample 306.

In addition to ablating phosphorous nitride film 302, the laser energy also melts a surface region of semiconductor sample 306. The depth of the melted region depends upon the laser energy and the pulse width (duration) as well as the thermal transport properties of the semiconductor (typically amorphous silicon) sample 306. A typical laser pulse width is approximately 50 nanoseconds. After receiving the laser pulse, the semiconductor remains in a molten state for a short time interval allowing semiconductor sample 306 to incorporate some of the dopant atoms released in the gap during the laser ablation process. The absorbed dopants are activated when semiconductor sample 306 solidifies. A more detailed description of using laser ablation is described in U.S. Pat. No. 5,871,826 (the '826 reference) entitled Proximity Laser Doping Technique for Electronic Materials by inventors Ping Mei, Rene A. Lujan and James B. Boyce which is hereby incorporated by reference.

In the '826 reference, a PSi doping material is the suggested doping material. However, PSi doping material tends to break down when exposed to moisture in air. The stability in air of DCC compounds, such as phosphorous nitride, allows the dopant source plate to be prepared off line in a batch process and stored until needed for use.

While the invention has been described in terms of a number of specific embodiments, it will be evident to those skilled in the art that many alternative, modifications, and variations are within the scope of the teachings contained herein. For example, variations in parameters may occur, such as the type of DCC compound, the method of deposition of the DCC compound, the type of laser used and the device being formed. Examples of other types of devices that may be formed using laser doping of phosphorous nitride include the fabrication of shallow junctions in Very Large Scale Integrated Circuits (VLSIs). Accordingly, the present invention should not be limited by the embodiments used to exemplify it, but rather should be considered to be within the spirit and scope of the following claims, and equivalents thereto, including all such alternatives, modifications, and variations.

What is claimed is:

1. A method of forming a thin film transistor structure comprising the operation of:

depositing a gate on a substrate;

forming an amorphous silicon layer over the gate and the substrate;

forming a passivation layer over the amorphous silicon layer;

creating an island from the passivation layer over the gate;

positioning dopant containing compound over the amorphous silicon layer;

exposing the dopant containing compound to a laser beam to dope the amorphous silicon with atoms from the dopant containing compound to create doped regions of amorphous silicon.

2. The method of claim 1 further comprising:

depositing and patterning metal contacts for a source and drain over the doped regions of amorphous silicon.

3. The method of claim 1 wherein the creating of the island from the passivation layer utilizes a backside exposure in which the gate serves as a mask.

4. The method of claim 1 further comprising:

removing excess dopant containing compound using plasma of dilute CF4 in oxygen.

5. The method of claim 1 wherein the dopant containing compound is phosphorous nitride.

6. The method of claim 5 wherein the positioning of the phosphorous nitride is done using a plasma enhanced chemical vapor deposition process.

7. The method of claim 5 wherein the positioning of the phosphorous nitride is done by positioning a transparent source plate, the transparent source plate includes a film of phosphorous nitride.

8. The method of claim 5 wherein a gap separates the phosphorous nitride film from the amorphous silicon, the doping of the amorphous silicon occurs through phosphor and nitrogen atoms that cross the gap.

* * * * *

UNITED STATES PATENT AND TRADEMARK OFFICE
CERTIFICATE OF CORRECTION

PATENT NO. : 6,818,535 B2
DATED : November 16, 2004
INVENTOR(S) : Jeng Ping Lu et al.

It is certified that error appears in the above-identified patent and that said Letters Patent is hereby corrected as shown below:

<u>Column 1,</u>
Line 9, insert as a new paragraph:
-- This invention was made with United States Government support under Agreement No. 70NANB7H3007 awarded by NIST. The United States Government has certain rights in this invention. --.

Signed and Sealed this

Sixth Day of June, 2006

JON W. DUDAS
*Director of the United States Patent and Trademark Office*